United States Patent [19]

Sember et al.

[11] Patent Number: 4,609,990
[45] Date of Patent: Sep. 2, 1986

[54] FREQUENCY MEASUREMENT SYSTEM

[75] Inventors: James W. Sember, Roanoke; Loren H. Walker, Salem, both of Va.

[73] Assignee: General Electric Company, Salem, Va.

[21] Appl. No.: 638,003

[22] Filed: Aug. 6, 1984

[51] Int. Cl.[4] ............................................. G01R 23/02
[52] U.S. Cl. ................................. 364/484; 324/78 R; 324/78 D; 324/78 E; 324/76 A
[58] Field of Search ........... 364/484; 324/78 R, 78 D, 324/78 E, 78 Q, 78 Z, 83 D, 99 D, 77 D, 76 A

[56] References Cited

U.S. PATENT DOCUMENTS

| 3,553,728 | 1/1971 | Frank et al. | 324/78 D |
| 3,590,277 | 6/1971 | South | 324/78 E |
| 4,050,747 | 9/1977 | Ruhnau et al. | 364/424 X |
| 4,112,358 | 9/1978 | Ashida | 324/78 D |
| 4,310,795 | 1/1982 | Fremereg | 324/83 D |
| 4,363,099 | 12/1982 | Srinivasan et al. | 324/83 D |
| 4,454,470 | 6/1984 | Boettner et al. | 324/78 R |

Primary Examiner—Edward J. Wise
Attorney, Agent, or Firm—Arnold E. Renner

[57] ABSTRACT

A method of developing a signal representative of the instantaneous frequency of an alternating current signal encompasses first determining the apparent frequency of the signal at the ends of sampling periods (e.g., half cycles). From successively derived apparent frequencies the rate of change in frequency is calculated. The actual frequency signal is then generated as a function of the apparent frequency and the rate of change. In a specific implementation, the method is employed to develop a signal representative of the rotational speed of a motor.

15 Claims, 6 Drawing Figures

| FIG.5A | FIG.5B |

FREQUENCY MEASUREMENT SYSTEM

REFERENCE MATERIAL

Reference is made to a microfiche appendix which sets forth a program listing applicable to the present invention. Included is one microfiche containing a total of 38 frames.

BACKGROUND OF THE INVENTION

The present invention relates generally to frequency measuring systems and, more particularly, to a method for developing a signal representative of the instantaneous frequency of an alternating current (AC) signal.

There are a number of frequency measuring systems available in today's art. In one form, the cycles of the signal being measured are counted for some period of time to give a direct value of the frequency. At low frequencies, this method is undesirable because long count periods are needed to give adequate resolution. A somewhat more sophisticated approach is to measure the period of the waveform and invert the value of the period to get a frequency indication. Although this method provides better results than the direct counting method described above, it does not give the optimum result, particularly when frequency is low or when it is rapidly decreasing in value.

Typically, in the prior art it is necessary to await the completion of at least one-half cycle of the alternating current signal being measured in order to get an indication of the frequency. As such, so long as the frequency is high, there is at least a fairly accurate indication of frequency at the end of the half cycle. When the frequency is decreasing in value and the new period is longer than that previously being measured, it is apparent that an increase in time is required for the frequency indication.

In U.S. Pat. No. 4,454,470, "Method and Apparatus for Frequency Measurement of an Alternating Current Signal" by F. H. Boettner et al., issued June 12, 1984, which patent and the teachings thereof are specifically incorporated hereinto by reference, there is described a scheme which develops the values alternately representing, respectively, the periods of successive half cycles of the alternating current signal. By comparing two such values, the last completed value with a value presently being generated, and by providing an output signal representing the value representing the longer period, there is provided a signal which is more representative of the instantaneous frequency when the frequency of the alternating current signal is decreasing. This is because that, although the frequency value is not exactly known, as soon as the value representing the presently being measured half cycle exceeds the value of the period of the half cycle last measured, there is provided an indication that the period is getting longer and hence that the frequency is decreasing.

Even the system of U.S. Pat. No. 4,454,470, however, can be considerably in error since it is always necessary to wait until the end of a half cycle to get an actual measure of the frequency. That is, during the period of a half cycle, there is no indication of the instantaneous frequency. It is further realized that in these prior art systems which require the completion of a half cycle for development of a frequency signal, the value provided is one which is proportional to the average frequency over the half cycle and not the frequency at the end of a half cycle. This is most readily visualized with reference to a system in which a counter develops a count proportional to the length of a half period. It is readily apparent that reliance upon the total count developed during a full half cycle gives a result representative of the average frequency during the half cycle and not the frequency at the end of the half cycle.

SUMMARY OF THE INVENTION

It is, therefore, an object of the present invention to provide an improved method for developing an indication of the instantaneous frequency of an alternating current signal.

It is a further object to provide an improved method of developing a signal representative of the instantaneous frequency of an AC signal, which method operates in a prediction mode.

It is a still further object to provide a method of developing a signal representative of the instantaneous frequency of an AC signal which is capable of providing revised signals in less than one-half cycle of the AC signal.

It is a still further object to provide a method of generating a signal representative of the anticipated instantaneous frequency of an alternating current signal which is varying in a substantially linear manner.

It is an additional object to provide a method of developing a signal representative of the instantaneous speed of a moving object such as a rotating motor.

The foregoing and other objects are achieved, in accordance with the present invention, by providing a method which develops a value representative of the anticipated instantaneous frequency of an alternating current (AC) signal by first determining the apparent frequency of the AC signal at the end of half cycles thereof. This signal is used with a successively similarly derived signal to determine the rate of change in frequency of the AC signal. An output signal representative of the instantaneous frequency of the AC signal in question is then derived as a function of the last determined apparent frequency and the last determined rate of change in frequency in a repetitive manner.

In the preferred embodiment of the invention, the apparent frequency of the AC signal at the end of each half cycle is derived as a function of the average frequency over that half cycle combined with approximately one-half of the anticipated change in frequency during that same half cycle.

BRIEF DESCRIPTION OF THE DRAWING

While the present invention is defined in particularity in the claims annexed to and forming a part of this specification, a better understanding can be had from the following description taken in conjunction with the accompanying drawings in which:

DETAILED DESCRIPTION

Figure 1:
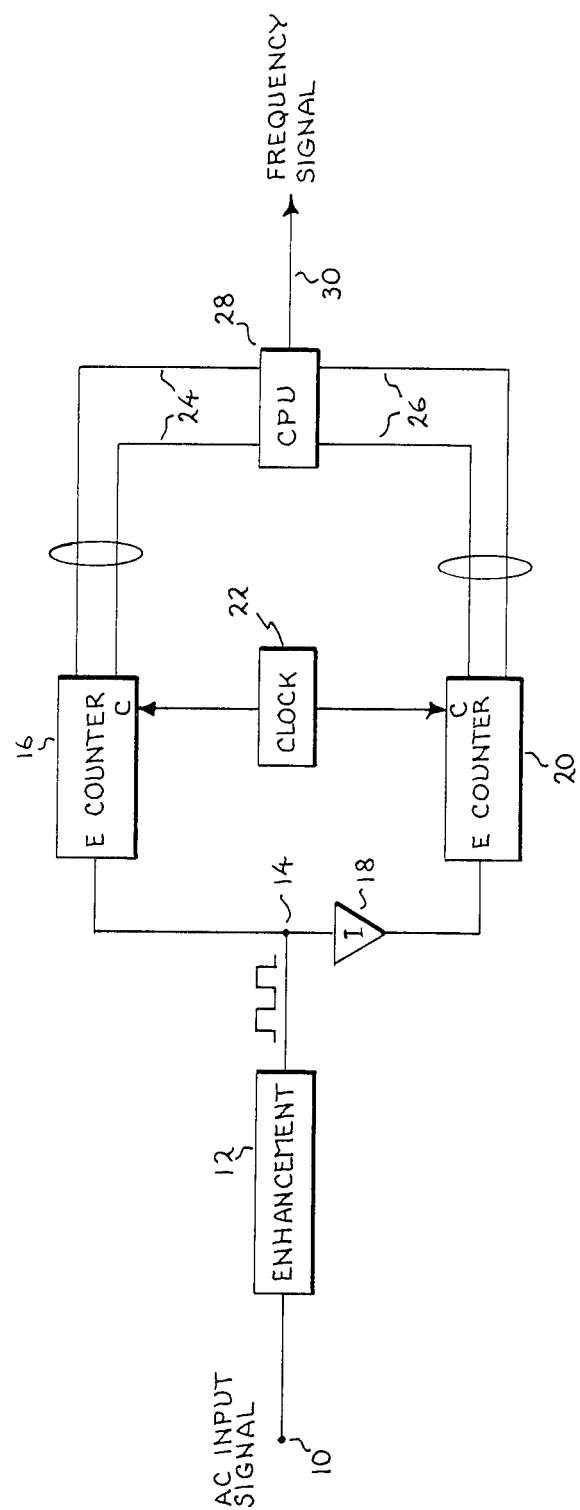
FIG. 1 is a high level schematic drawing illustrating the environment and basic components used in the method of the present invention in accordance with a preferred embodiment.
Figure 2:
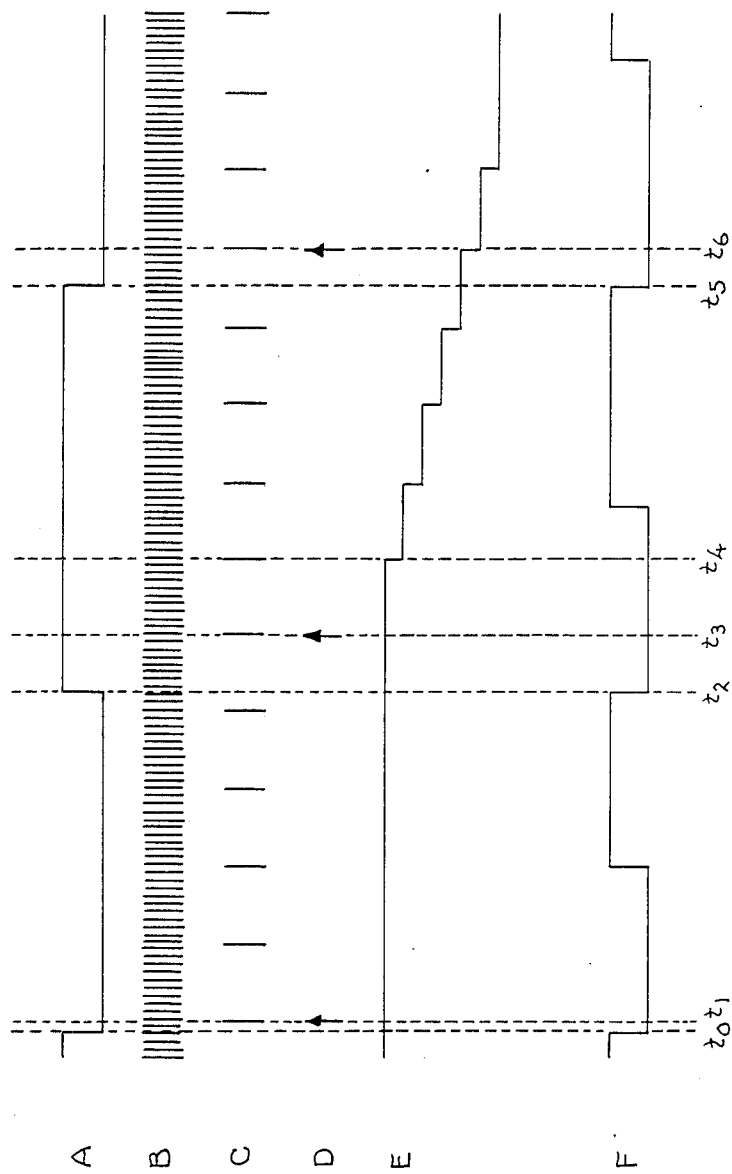
FIG. 2 illustrates certain waveforms, drawn to the same time base, useful in understanding the present invention.

Reference is now made to FIG. 1 which shows the basic environment for the implementation of the method of the present invention and to FIG. 2 which illustrates certain waveforms which are helpful in the understanding of this method. FIGS. 1 and 2 illustrate a digital implementation of the present invention in keeping with the more practical form in view of today's technology. It will be apparent, however, to those skilled in the art that equivalent analog implementations, as by operational amplifiers, integrators, etc., may be also employed.

In FIG. 1, the AC signal whose frequency is desired to be known, is supplied from some source (not shown) to input terminal 10. This input signal is then enhanced to the extent necessary as by the use of appropriate zero crossing detectors, shaping circuits, etc., all of which are well known and generally illustrated by block 12, to provide at a well defined AC signal at node 14. This signal, a well defined square wave signal having relatively negative and positive portions of substantially equal duration when the frequency of the AC signal at node 14 is not changing, is illustrated as trace A of FIG. 2. The signal at node 14 is applied directly to the enabling gate of a first counter 16 and is further applied by way of an inverter 18 to the enabling gate of a second counter 20. Each of the counters 16 and 20 further receives the output of a suitable clock which provides to these two counters a series of pulses such as shown in trace B of FIG. 2. As such, the counter which is enabled counts the clock pulses so long as there is an enabling signal present at its enabling gate. Counters 16 and 20 may be either count-up or count-down counters. In the specific implementation of the present invention to be later described, the counters are of the count-down variety which are preset with a value upon the occurrence of the enabling signal, all in the manner well known in the art.

In accordance with the embodiment illustrated in FIG. 1, when the signal at node 14 is relatively positive, counter 16 is enabled and will count down from its preset count at the rate provided by the clock pulses as long as that signal is positive. Correspondingly, when the signal at node 14 is relatively negative, counter 20 will be enabled and will count down in accordance with the clock pulses applied thereto. The outputs of counters 16 and 20 are applied, via lines 24 and 26, respectively, to the central processing unit of a suitable computer or data processor 28 such as an Intel 8088 microprocessor.

In accordance with the method to be described, processor 28 utilizes the signals on lines 24 and 26 to generate at its output 30 a signal which is proportional to the instantaneous frequency of the AC input signal at terminal 10.

An understanding of the basic method of the present invention may be had with respect to FIG. 2 taken in conjunction with the description of FIG. 1. As earlier indicated, the AC input signal to be measured is represented by trace A of FIG. 2 while the clock pulses are illustrated by trace B of that figure. Trace C of FIG. 2 indicates the program cycles of the CPU 28 which are normally at a fixed duration, for example, 800 microseconds. The program cycles are asynchronous with respect to the frequency and as will be explained the counters 16 and 20 are, therefore, asynchronously read with respect to the frequency.

Clock 22 runs at a predetermined frequency. As such, the count in a counter will represent the period and hence the average frequency of the particular half cycle during which it counts. Although it is conceivable that the signal at node 14 could be utilized to signal the central processor that there has been a change in polarity of the input signal, since there is an asynchronous reading it is a simple matter for the computer to determine this occurrence merely by sampling the contents of the two counters once during each program cycle (trace C). By way of illustration, in accordance with the previous description and with reference to FIG. 2, during the time period from $t_0$ to $t_2$, counter 20 will be counting down as a function of the clock pulses applied thereto while counter 16 will be stationary. Thus, as the CPU 28 samples the content of counter 16 once in each program cycle in this time period, it will not see any change in the count. However, the polarity of the input signal changes at time $t_2$ disabling counter 16 and enabling counter 20. Thus, at time $t_3$ the CPU will recognize that counter 16 which was previously stationary between the last two program cycles has now decreased in value and thus conclude that counter 20, which was counting during the period $t_0$ to $t_2$, is stationary and has new data available. That is, counter 20 now has a count representing the average frequency of the input signal during the period $t_0$ to $t_2$. Thus, at each program period after which there has been a change in polarity of the input signal, illustrated by trace D, new information is available to the central processing unit 28.

With the foregoing as background and still with reference to FIGS. 1 and 2, the predictive nature of providing the instantaneous frequency value will be described. Trace E in FIG. 2 represents the output signal on line 30 in FIG. 1. Let it be first assumed that the frequency calculation made at time $t_1$, the program cycle time immediately following a change in polarity of the input signal at time $t_0$, determined that there was no change in frequency from the previous frequency determination also made in accordance with the present invention. As such, CPU 28 will, at time $t_1$ make a computation based purely upon the value of the count in counter 16. Thus, during the period $t_1$ to $t_2$ a substantially constant output signal determined in accordance with that computation will be provided. Let it be further assumed, however, that during the period represented between times $t_0$ and $t_2$ the frequency of the input signal decreases such that the count in counter 20 is representative of a larger time period than that previous registered (i.e., at time $t_1$). As such, at time $t_3$ when the CPU 28 next determines that new data is available in the registers, it will determine from the new frequency computation based upon the count in register 16 not only the average frequency for the half cycle but also by simple subtraction, a value which is indicative of the change in frequency during that half cycle. This change can be translated into the rate of change for each program cycle by dividing the change in frequency by the number of program cycles during the $t_0$ to $t_2$ half cycle to give a "delta signal". Based upon the assumption that the rate of change will remain constant for the next half cycle of the input signal, the present invention provides that this delta signal is repetitively combined at each program cycle in a cumulative fashion to the apparent frequency as determined at the end of the last half cycle. In FIG. 2, the decrease in frequency determined is illustrated (trace E) as a step decrease in the signal on line 30 which steps down by an amount "delta" at each program cycle.

As a numerical example, let it be assumed that the calculation made by the processor in accordance with the present invention was that the frequency was decreasing by one-half hertz each 800 microseconds (each program cycle). Beginning at time $t_4$, the first program cycle after the computation is made, the output signal on line 30 (trace E) is adjusted in a step function at each program cycle to provide an output signal which is proportional to the anticipated frequency at that time.

At time $t_5$ there is another change in polarity of the input signal such that at time $t_6$ this change is recognized as is the fact that new frequency data is available in the counters. (In the present illustration, counter 16 now has a completed count.) The present invention also recognizes, however, that the frequency was predicted to change throughout the period $t_2$ to $t_5$ and that counter 16 contains a count representing only the average frequency over that period of time (half cycle). In accordance with the present invention, therefore, the frequency represented by the count in the counter 16 is adjusted by an amount equal to one-half of the change that was predicted to occur during that half cycle (time $t_2$ to $t_5$) thus to provide an apparent frequency signal which is representative of the actual frequency at time $t_5$. This apparent frequency value at time $t_5$ is then used in conjunction with the value determined for the immediately preceding change (i.e., time $t_3$) to determine the anticipated rate of change for the next half cycle (e.g., starting at $t_5$). This process is repeated for each half cycle of the input signal with new delta signals being determined and apparent frequencies calculated with the delta signals being cumulatively combined at each program cycle to provide a continuously updated signal representative of the extant frequency of the input signals.

As a numerical example of the foregoing, let it be assumed that for time $t_2$, the apparent frequency of the input signal as determined by the present invention was 2000 hertz. Let it be further assumed that, based upon the determinations made for the half cycles ending at times $t_0$ and $t_2$, the frequency was decreasing at a rate of 6 hertz per program cycle and that there were 5 program cycles during the half cycle under consideration. Let it be still further assumed that the count in counter 20 at time $t_5$ represents a frequency of 1985 hertz (the average frequency over the period.) By taking that latter value and subtracting from it one-half of the anticipated frequency change over the entire half cycle (e.g. $5 \times 6/2 = 15$) the present invention method provides an output value at time $t_5$ which is representative of 1970 hertz which is a more accurate representation of the true instantaneous frequency of the input signal at time $t_5$ representation.

As earlier stated, the present invention has particular application in those situations in which, regardless of the actual frequency change in a half cycle, the rate of change in frequency during that half cycle is substantially constant. An example of such a situation and of a particular embodiment of the present invention is for use with an alternating signal indicative of motor speed. In such an embodiment, the inertia of the motor renders instantaneous changes in speed, and hence in the AC signal representative thereof, virtually impossible.

Figure 3:
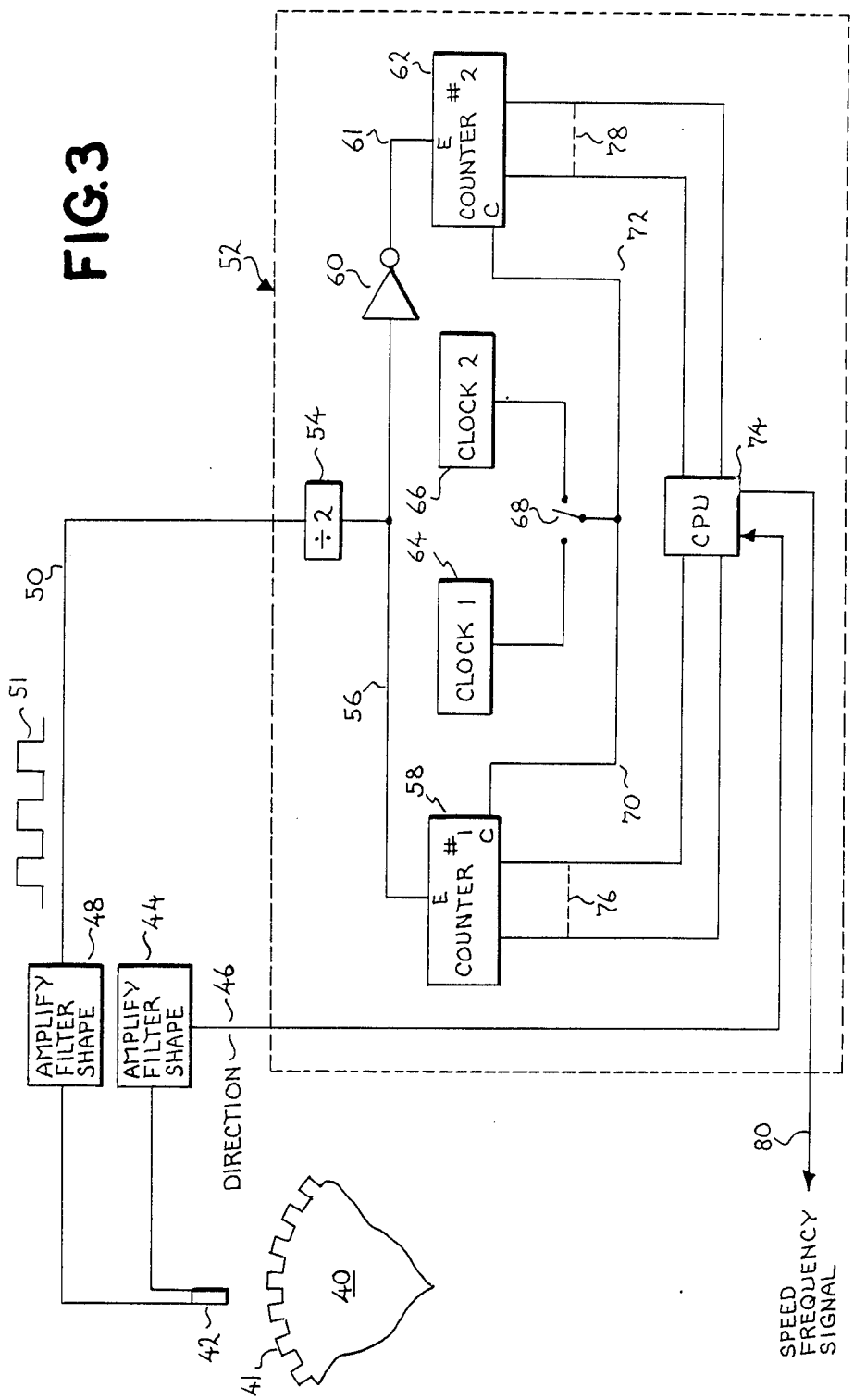
FIG. 3 is a high level schematic drawing illustrating the use of the present invention for the development of a signal representing the instantaneous speed of a rotating motor.

FIG. 3 represents one embodiment of the present invention in which the alternating current signal being measured is one which is representative of the speed of a motor. With specific reference to FIG. 3, illustrated is a portion of a toothed wheel 40 which is connected to the shaft of a motor (not shown) the speed of which is to be measured. The number of teeth 41 on the wheel would, of course, be selected in accordance with the system parameters of wheel size, motor speeds, etc. A suitable pickup means, such as a Hall effect pickup 42 which does not require relative motion between the wheel and the pickup is provided adjacent the wheel teeth. The pickup 42 provides a first signal which is indicative of the direction of wheel rotation. This first signal is processed for better definition as by amplifying, filtering and shaping in stage 44 to develop on its output line 46 a signal which is indicative of the direction of rotation of the wheel 40.

The primary output of the pickup 42 is a signal representative of the presence or absence of a tooth 41 adjacent the pickup. This signal may also be processed by a circuit 48 to provide on line 50 a signal comprised of a series of pulses 51 representative of the time periods during which a tooth 41 is adjacent the pick up. For purposes of this description, a relatively positive signal from the circuit 48 represents the presence of a tooth beneath the pickup 42 while a relatively negative signal represents the absence of a tooth (i.e., a slot) below the pickup. Thus, when the motor and hence wheel 40 are rotating the output of circuit 48 will be an alternating current signal (signal 51) the frequency of which is proportional to the speed of the motor.

In FIG. 3, the direction signal on line 46 and the speed (AC) signal on line 50 are applied to a suitable computational system 52 which may include, for example, an Intel 8088 microprocessor 74 programmed in PLM-86 and ASM-86 languages. As indicated, the frequency of the pulse train 51 will be proportional to the motor speed. To ensure symmetry, this signal is furnished to a "divide-by-two" circuit 54 which provides, at its output, a series of well defined pulses which will have one-half the frequency of the signal 51. This signal from circuit 54 is applied to a first counter 58 by way of line 56 and to a second counter 62 by way of an inverting circuit 60 and line 61. Counters 58 and 62 correspond to counters 16 and 20 of FIG. 1. Thus, counter 58 will be enabled when the output of the divide-by-two circuit is relatively positive and the counter 62 will be enabled when the output of the divide-by-two circuit 54 is relatively negative. In the context of the present invention, therefore, the output of the divide-by-two circuit 54 is the alternating current signal which is to have its frequency measured. With respect to FIG. 2, the alternating current signal 51 on line 50 is represented by trace F while the output of the divide-by-two circuit 54, that is, the alternating current having a frequency to be measured is that shown in trace A.

Each of the counters, 58 and 62, is selectively provided with clock signals from one of two clocks 64 and 66. Two clocks are included in this embodiment to enhance to the overall accuracy of the method control signal since the frequency of the signal to be measured may vary greatly; i.e., from essentially zero hertz representing zero motor speed to some higher number representing, perhaps several thousand revolutions per minute. As possible examples, clock 64 might have an output frequency of 115.2 kilohertz for use at lower motor speeds while clock number 66 might have an output frequency of 1.8432 megahertz (sixteen times that of clock 64) for use at higher motor speeds. This type of expediency to alleviate the need for extraordinary large counters is well known. The selection of the clock to be used by the counters is schematically illustrated by the position of a switch 68. In reality, of course, the selection of the clock would be a function of the computer being used with switching being accomplished at some predetermined motor speed or possibly speeds depending upon whether the motor was speeding up or slowing down.

In the same manner as described with respect to FIG. 1, counters 58 and 62 are appropriately enabled by the output state of the circuit 54 to correspondingly develop count values (e.g., as by counting down) at a rate according to the clock signals respectively supplied to the counters on lines 70 and 72. Also in a manner functionally identical with that described with respect to FIG. 1, a central processing unit (CPU) 74 samples the contents of the counters via respective lines 76 and 78 and provides an output signal proportional to the frequency of the AC input signal (i.e., motor speed) on output line 80.

The basic method of the speed (frequency) calculation in the FIG. 3 implementation is that described with respect to FIG. 1 and further discussion of that method is not believed necessary. Since, however, the particular embodiment of motor operation is included, several additional factors deserve consideration, particularly since the flow chart and appendix which form a part of this specification are particularly adapted to that application.

First of all, since the basic computation is one relative to frequency, a conversion to speed is required. This may be accomplished in accordance with the relationship:

$$\text{Speed (RPM)} \frac{\text{Clock Frequency (counts/sec)} \times 60 \text{ (sec/min)}}{\text{Count (counts/pulse)} \times \text{No. teeth (pulses/rev)}} \quad (1)$$

A further factor which requires consideration in this implementation is that of the use of the two clocks. In a specific implementation of the present invention represented by the flow chart, the switching of clocks used is a function of motor speed (either calculated or predicted using the delta signal). As such, it is possible to switch clocks within a half cycle. In the event of such a change, the method of the present invention recognizes the existence thereof and forces a prediction of speed based upon the last derived delta value for sufficient time to assure correct counter data (e.g., at least through the next full half cycle). In accordance with the specific implementation defined by the included flow chart and program listing, this is achieved by forcing the prediction through a prescribed number of program cycles (trace D of FIG. 2). This is readily possible since the motor speed at which the change occurs is known as is the time (e.g., 800 microseconds) required for each program cycle.

There is an additional complication for this situation of clock change because the value of the speed calculated by equation (1) above, when new information is finally obtained after the forced predictions, cannot be adjusted by merely one-half of the total accumulated predicted speed, i.e., one-half the accumulated delta signals. This is due to the fact that the value of one-half of the delta signals of predicted speed change no longer represents the amount of speed change that equation (1) neglects. Instead, the adjustment for equation (1) which is used, consists of the value used to adjust equation (1) before the forced prediction ensued, multiplied by the number of program cycles in the half cycle which occurs immediately before calculation by equation (1) is allowed to take place, divided by the number of program cycles which were used to obtain the previous adjustment. By way of example, as set forth in the specific listing and flow chart attached, assume the end of a half cycle (trace A of FIG. 1) occurs, that speed was calculated to be a certain value by equation (1) and that value was adjusted as was previously described by combining that calculated value with one-half the total accumulated predicted speed over four program cycles. The number of counts for this speed was low enough so that the count of clock frequency was changed to the lower value and the prediction was forced for twelve program cycles. After eight program cycles of forced prediction, the software detected that new information was obtained. After four more program cycles, forced prediction was no longer in effect but the software continued predicting until new information was obtained; i.e., until the current occurrence of a half cycle determination as shown by trace A. Thus, four more program cycle predictions were completed and new information was obtained the second time. In this situation the new value of speed is calculated by equation (1) is adjusted by adding the quantity: $(A \times 8/4)$ wherein A is the total value of accumulated predicted speed change over four program cycles.

Figures 4, 5:
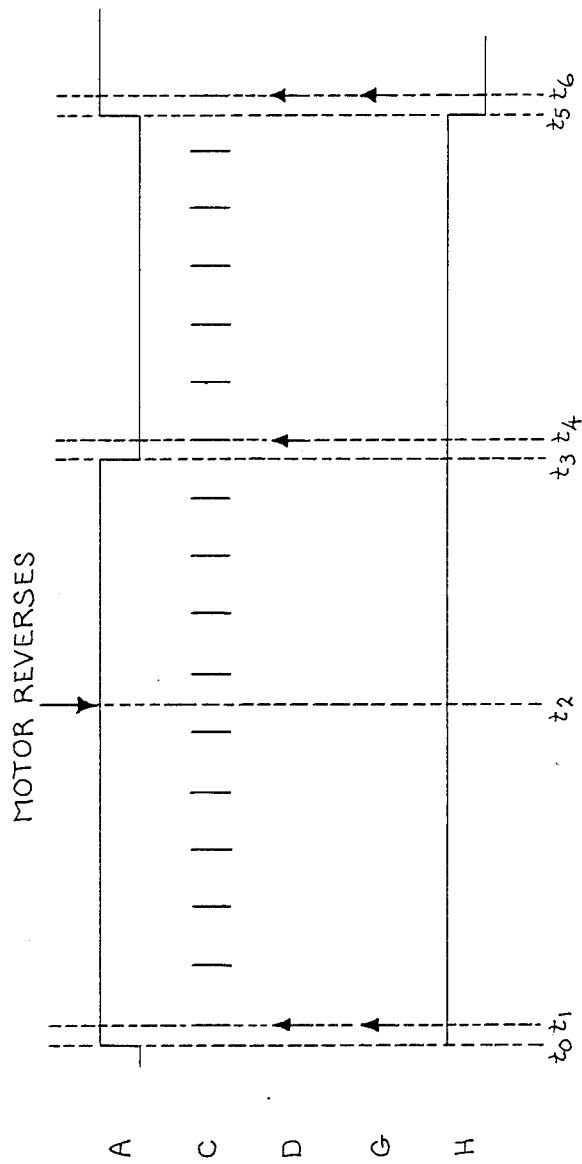
FIG. 4 illustrates certain waveforms, drawn to the same time base, helpful in the understanding of the FIG. 3 embodiment of the present invention; and, FIGS. 5A and 5B taken together as shown in FIG. 5 constitute a flow chart illustrative of the method of the FIG. 3 embodiment of the present invention and in explanation of the specific program listing as presented in the aforementioned microfiche appendix.

A similar computation occurs when the motor reverses and in this regard reference is made to FIG. 4 which shows traces A, C and D which are similar to the traces so designated in FIG. 2. FIG. 4 further includes trace G which indicates the times in which there is a calculation and adjustment and trace H which is an indication of the motor direction signal, the generation of which is demonstrated in FIG. 3. As shown in FIG. 4, the motor actually reverses direction during the longest apparent half cycle, that is at time $t_2$ during the period between the time $t_0$ and $t_3$. As indicated in trace H, however, the actual motor speed signal does not change until after a significant longer period. When the longest period is over (time $t_3$), the normal operation would require that there be a calculation of motor speed via equation (1) and an adjustment thereof by one-half of the sum of the delta signals. However, since the motor actually stopped in the middle of this period as is indicated by the reversal indication, the number of counts in the period no longer represents motor speed. (It will be remembered that the pickup of FIG. 3 was of the non-motion type. As such, its output continues the enablement of the appropriate counter as long as the tooth-slot relationship beneath the pickup does not change.) Therefore, when the software predicts a direction change, a flag is set and the prediction continues until the end of the second pulse (time $t_5$) after the predicted reversal. Here as with the previous forced prediction situation, the adjustment to the value of speed calculation by equation (1) must be non-standard. The method already explained with respect to the clock change is utilized and the number of program cycles in the numerator of the adjustment quantity represents the length of that second half cycle after reversal. A further detail which comes into play during speed reversal is a result of the fact that the motor direction speed signal does not change until some time after the motor is actually reversed. As shown by the flow chart, the software allows the predicted motor direction to differ from the motor direction signal for as many as 125 program cycles or until the first time speed is calculated and adjusted after reversal, whichever occurs first.

A final factor to be considered is that in the implementation shown by the flow chart, at higher speeds it is considered that the average speed was close enough to the actual speed such that the adjustment by the sum of one-half at the sum of the delta signals was not necessary. Therefore, the delta adjustments are omitted at speeds above a predetermined value simply as expediency and to facilitate a rapid indication of actual speed. Although delta adjustments are not made, speed rate of change calculations continue to be made so that when the speed reaches a lower value, valid delta adjustments can be made.

Figure 5A:
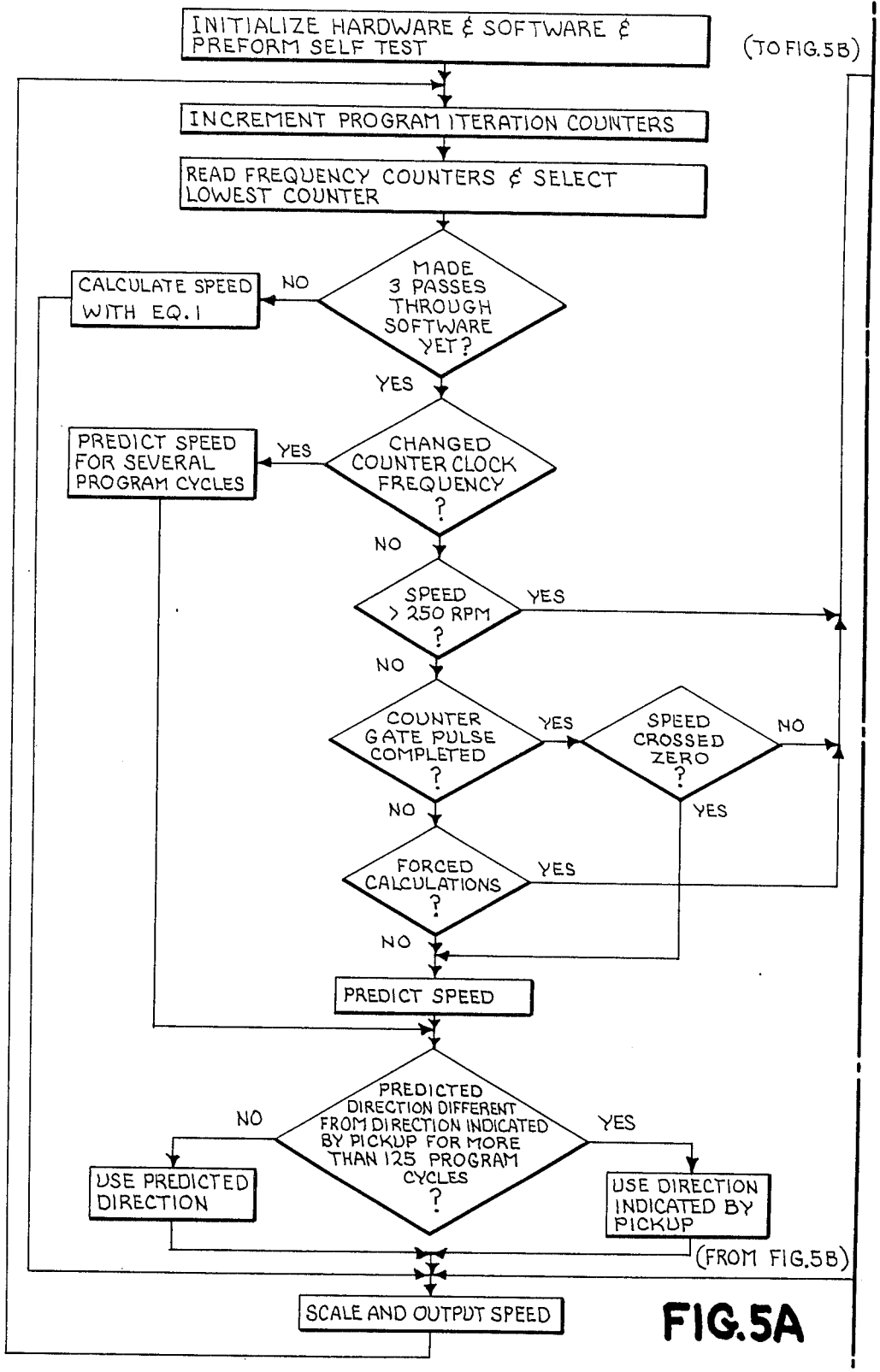
Figure 5B:
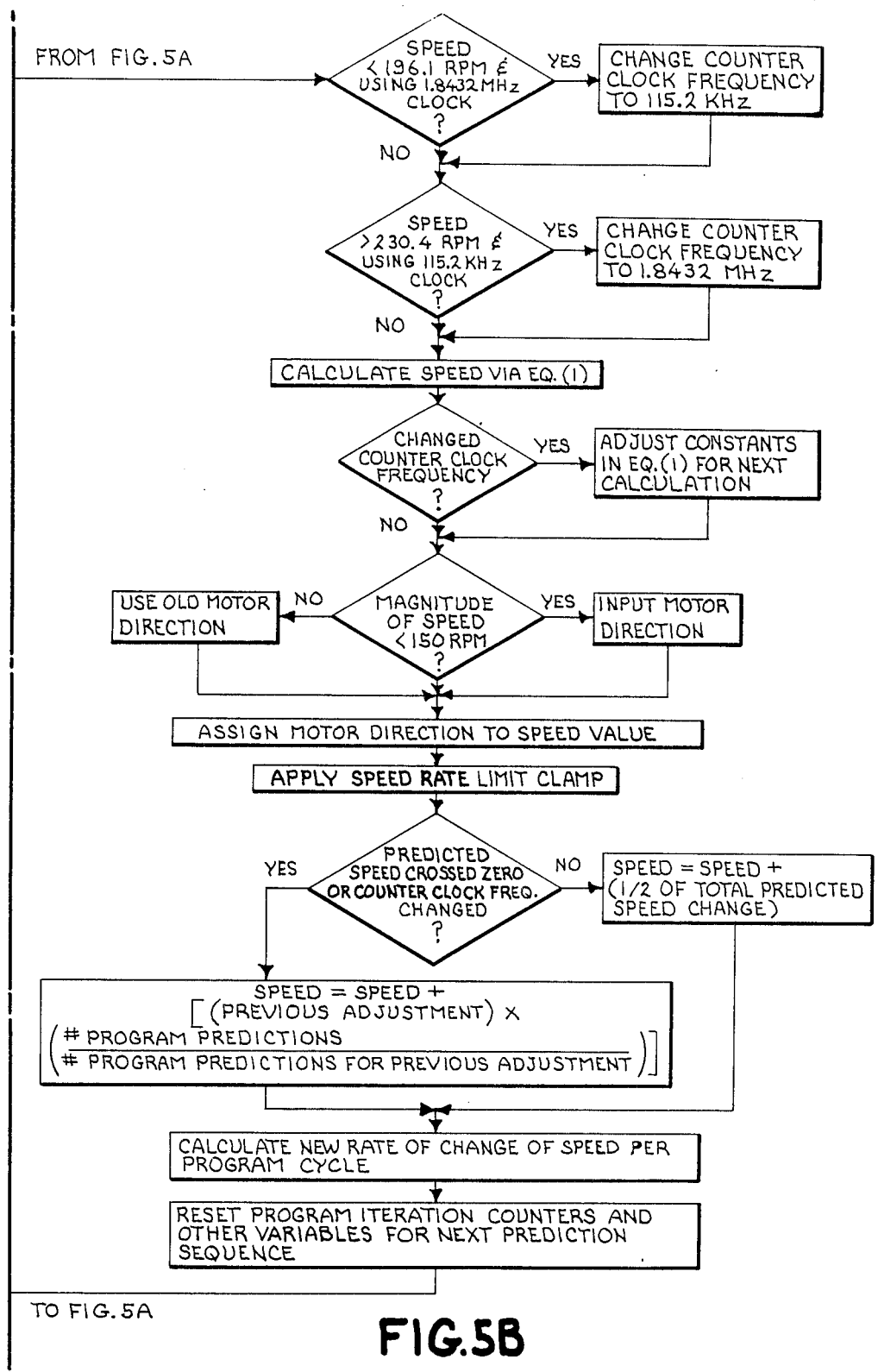

A detailed program implementing the present invention as a motor speed signal listing is shown in the microfiche appendix. FIGS. 5A and 5B constitute a flow chart of that listing and in view of the prior discussion, a detailed explanation of this flow chart is believed unnecessary as being self-explanatory by a reading thereof.

Thus, there has been seen described a method which is capable of very accurate predictions of the frequency of an input signal which method is readily accomplishable at a minimum cost.

While the invention has been described in what are presently considered to be the preferred embodiments, modifications thereto will readily occur to those skilled in the art. For example, the specific embodiments shown are to a system in which interrupted operation of the CPU was undesired. If processor interruption can be permitted, a single counter could be used through the expediency of storing a count value after a sampling period (i.e., a half cycle) is completed, resetting the counter and beginning a new count for the next half cycle. In addition, the specific examples described utilized only first order changes of frequency with respect to time. Higher order changes could be used but in most instances the increased accuracy thus attained is negligible. Thus, as defined in the appended claims, rate of change is intended to encompass any or all derivatives of frequency with respect to time. It is not desired, therefore, that the invention be limited to these specific embodiments shown and described and it is intended to cover, within the appended claims, all such modifications as fall within the true spirit and scope of the invention.

What is claimed:

1. A method of providing an output signal having a value representative of the anticipated instantaneous frequency of an alternating signal comprising the steps:
    (a) determining the apparent frequency of said alternating current signal at the end of a half cycle of said alternating current signal;
    (b) deriving from successively determined apparent frequencies a rate of change in frequency; and,
    (c) developing said output signal as a function of the last determined apparent frequency and a last determined rate of change in frequency.

2. The invention in accordance with claim 1 wherein said output signal is periodically adjusted during a half cycle by adding to the last developed output signal a delta signal representing the anticipated change in frequency since the last previous adjustment of said output signal.

3. The invention in accordance with claim 1 wherein said apparent frequency at the end of a half cycle is determined by determining a value representing the average frequency during the just completed half cycle and combining that value with a second value equal to approximately one-half of the total amount of frequency change anticipated in the one-half cycle of said alternating current as calculated from said last determined rate of change in frequency.

4. The invention in accordance with claim 1 wherein said output signal is periodically adjusted by adding to the last developed output signal a delta signal representing the anticipated change in frequency since the last previously adjustment of said output signal and wherein said apparent frequency at the end of a half cycle is determined by determining a value representing the average frequency during the just completed half cycle and combining with that value a second value which is equal to approximately one-half of the total amount of frequency change anticipated in the half cycle of said alternating current signal as determined from said last determined rate of change in frequency.

5. A method of developing an output signal having a value representative of the instantaneous frequency of an alternating current signal comprising the steps:
    (a) respectively developing first and second count values representing respectively a time said alternating current signal exists in alternate half cycles;
    (b) determining the apparent frequency of said alternating current signal at the end of a half cycle as a function of the last said developed count and a value representing an anticipated rate of change in frequency;
    (c) deriving said value representing the anticipated rate of change as a function of two successively determined apparent frequencies; and,
    (d) developing said output signal as a function of said last developed apparent frequency and the last determined value representing rate of change.

6. The invention in accordance with claim 5 wherein said value representing the anticipated rate of change in frequency is derived as a function of the difference between two successively derived apparent frequencies.

7. The invention in accordance with claim 5 wherein the step of determining the apparent frequency is further defined as utilizing the last developed count to determine a value representive of the average frequency of said alternating current signal over a just completed half cycle and combining said value representative of the average frequency with a second value representing approximately one-half of an anticipated change in frequency over the just completed half cycle calculated from said value representing the anticipated rate of change.

8. The invention in accordance with claim 5 wherein:
    (a) said value representing the anticipated rate of change in frequency is derived as a function of the difference between two successively derived apparent frequencies;
    (b) the step of determining the apparent frequency is further defined as utilizing the last developed count to determine a value representative of the average frequency of said alternating current signal over a just completed half cycle; and, (c) combining said value representative of the average frequency with a second value representing approximately one-half of an anticipated change in frequency over the just completed half cycle calculated from said value representing the anticipated rate of change.

9. The invention in accordance with claim 5 wherein said alternating current signal is developed as a function of the rotational speed of a motor and wherein said output signal represents the rotational speed of a said motor.

10. A method of measuring the frequency of an alternating current signal comprising the steps:
  (a) repetitively developing first and second count values representing respectively the times that the alternating current signal exists in alternate half cycles;
  (b) retaining the last fully developed count value representing the last fully completed half cycle while developing a count value representing the extant half cycle;
  (c) periodically examining each of said count values to determine the completion of a half cycle;
  (d) determining from a just completed count value the average frequency of said alternating current signal for a just completed half cycle;
  (e) deriving an actual frequency signal for a just completed half cycle by combining said average frequency signal with a change signal representing approximately one-half of a predicted frequency change between said just completed half cycle and intermediately preceding completed half cycle; and
  (f) determining said change signal by calculating the rate of change in frequency between said just completed half cycle and the half cycle completed immediately therebefore.

11. The invention in accordance with claim 10 wherein said actual frequency signal is periodically adjusted during an extant half cycle by periodically adding to a last developed of such signal, a delta signal representing the anticipated change in frequency since the last previous adjustment of such signal.

12. A method of providing an output signal representative of the instantaneous rotational speed of a rotating motor comprising the steps:
  (a) generating an alternating current signal representative of said rotational speed, said alternating signal having substantially equal relatively negative and positive alternating sampling periods when said motor speed is constant;
  (b) repetitively developing first and second signals representing, respectively, the time periods of said negative and positive time periods;
  (c) retaining the last fully developed of said first and second signals while developing the other thereof;
  (d) periodically examining each of said first and second signals to determine the completion of a sampling period;
  (e) determining from a just fully developed of such signals an average speed signal indicative of the average motor speed during the just complete sampling period;
  (f) deriving an actual speed signal at the end of each sampling period by combining an average speed signal with a change signal representative of an anticipated change in speed of said motor during the first completed sampling period;
  (g) deriving said change signal as a function of the two immediately preceding derived actual speed signals; and,
  (h) generating said output signal for each sampling period by first utilizing the last derived actual speed signal and then periodically adjusting said output signal by a delta signal representing the anticipated change in motor speed since the time of the last adjustment.

13. The invention in accordance with claim 12 wherein said delta signal is representative of the rate of change in motor speed determined from two successive previously derived actual speed signals.

14. The invention in accordance with claim 13 further including:
  (a) predicting on the basis of a last derived actual speed and a last developed delta signal that the motor will reverse its direction of rotation during a specified sampling period; and,
  (b) based upon such prediction, altering the method of output signal development by, for a specific period of time in excess of the sampling period during which reversal is predicted, continuing the development of said output signal as a function of said last derived actual speed and delta signals.

15. The invention in accordance with claim 12 further including:
  (a) predicting on the basis of a last derived actual speed and a last developed delta signal that the motor will reverse its direction of rotation during a specified sampling period; and,
  (b) based upon such prediction, altering the method of output signal development by, for a specific period of time in excess of the sampling period during which reversal is predicted, continuing the development of said output signal as a function of said last derived actual speed and delta signals.

* * * * *